(12) United States Patent
Yang

(10) Patent No.: US 6,627,471 B2
(45) Date of Patent: Sep. 30, 2003

(54) METHOD OF MANUFACTURING AN ARRAY SUBSTRATE HAVING DRIVE INTEGRATED CIRCUITS

(75) Inventor: Joon-Young Yang, Bucheon-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/157,200

(22) Filed: May 30, 2002

(65) Prior Publication Data

US 2002/0182833 A1 Dec. 5, 2002

(30) Foreign Application Priority Data

Jun. 1, 2001 (KR) ........................................ 2001-30702

(51) Int. Cl.[7] .................... H01L 21/00; H01L 21/3205
(52) U.S. Cl. .................... 438/30; 438/154; 438/587; 438/153; 438/149; 438/29
(58) Field of Search .................... 438/30, 29, 149, 438/587, 637, 206, 157, 689, 197, 738, 238, 268, 159, 25, 682, 151, 153, 34, 158, 48, 154, 684

(56) References Cited

U.S. PATENT DOCUMENTS 5,985,701 A * 11/1999 Takei et al. ................ 438/154
6,072,193 A * 6/2000 Ohnuma et al. .............. 257/57
6,225,150 B1 * 5/2001 Lee et al. .................... 438/153

* cited by examiner

*Primary Examiner*—Matthew Smith
*Assistant Examiner*—Igwe U. Anya
(74) *Attorney, Agent, or Firm*—McKenna Long & Aldridge LLP

(57) ABSTRACT

A method of manufacturing an array substrate having drive integrated circuits and first and second semiconductor layers made of single crystalline silicon. First and second gate electrodes are formed over the first and second semiconductor layers, wherein the first and second gate electrodes are narrower than the first photoresist patterns. First and second insulator patterns are formed on the first and second semiconductor layers, wherein the first and second insulator patterns having a substantially equal width to the first photoresist patterns. N$^+$ ion doping is carried out using the first photoresist pattern as a mask. The first photoresist patterns are ashed, thereby the first photoresist patterns become reduced first photoresist patterns, wherein the reduced first photoresist patterns have substantially the same width as the first and second gate electrodes. A second photoresist pattern is formed, which covers the first gate electrode and the first semiconductor layer. P$^+$ ion doping is carried out using the second photoresist pattern as a mask. The p$^+$ ion dose is larger than the n$^+$ ion dose.

20 Claims, 17 Drawing Sheets

METHOD OF MANUFACTURING AN ARRAY SUBSTRATE HAVING DRIVE INTEGRATED CIRCUITS

This application claims the benefit of Korean Patent Application No. 2001-30702, filed on Jun. 1, 2001 in Korea, which is hereby incorporated by reference for all purposes as if fully set forth herein.

BACKGROUND OF THE INVENTION

1. Field of the Invention

The present invention relates to an array substrate of a liquid crystal display (LCD) device and more particularly, to a method of manufacturing an array substrate having drive integrated circuits (drive ICs).

2. Discussion of the Related Art

Due to a rapid development in information technology, display devices have evolved into instruments that can process and display a great deal of information. Flat panel display devices, which have properties of being thin, low weight and low power consumption, such as liquid crystal display (LCD) devices, have been developed. The LCD device is widely used for notebook computers and desktop monitors, etc. because of its superior resolution, color image display and quality of displayed images. The LCD device consists of an upper substrate, a lower substrate and a liquid crystal layer disposed between the upper and lower substrates. The LCD device uses an optical anisotropy of liquid crystal and produces an image by controlling light transmissivity by varying the arrangement of liquid crystal molecules, which are arranged by an electric field.

One substrate of the LCD device includes a thin film transistor that acts as a switching device. An LCD device, which includes the thin film transistor, is referred to as an active matrix liquid crystal display (AMLCD) and it has a high resolution and can display an excellent moving image. Amorphous silicon is widely used as an active layer of the thin film transistor because amorphous silicon can be formed on a large, low cost substrate such as glass.

The LCD device also includes a drive integrated circuit (drive IC) that controls the thin film transistor. Unfortunately, amorphous silicon does not form a suitable active layer for the drive IC, which usually includes CMOS (complementary metal-oxide-semiconductor) devices that require crystalline silicon as active layers. Because of this, the drive IC is usually connected to the array substrate using a TAB (tape automated bonding) system. This adds significant cost to the LCD device.

Because of limitations of amorphous silicon, an LCD device that incorporates polycrystalline silicon as an active layer is being researched and developed. Polycrystalline silicon is highly beneficial because it is much better suited for use in the drive IC than amorphous silicon. Polycrystalline silicon thus has the advantage that the number of fabrication steps could be reduced because a thin film transistor and a drive IC could be formed on the same substrate, eliminating the need for TAB bonding. Furthermore, the field effect mobility of polycrystalline silicon is 100 to 200 times greater than that of amorphous silicon. Polycrystalline silicon is also optically and thermally stable.

FIG. 1 is a schematic block diagram showing an array substrate of a conventional liquid crystal display (LCD) device having drive integrated circuits (drive ICs). In FIG. 1, the LCD device includes a driving portion 3 and an image portion 4 on a substrate 2. The image portion 4 is located in the center of the substrate 2, and the gate driving portion 3a and the data driving portion 3b are located in the left and top regions of the substrate 2. In the image portion 4, a plurality of gate lines 6 are disposed horizontally and a plurality of data lines 8 are disposed vertically. The gate lines 6 and the data lines 8 cross each other to define a plurality of pixel regions. A pixel electrode 10 is disposed in the pixel region and a thin film transistor "T", switching device, is formed in the form of matrix at each crossing of the gate lines 6 and the data lines 8. Each thin film transistor "T" is connected to each pixel electrode 10. The gate driving portion 3a, which includes a plurality of drive ICs, supplies an address signal to the gate lines 6, and the data driving portion 3b, which also includes a plurality of drive ICs, supplies an image signal to the data lines.

The gate driving portion 3a and the data driving portion 3b are electrically connected to an outer control circuit (not shown) with signal input terminals 12 which are formed on one edge of the substrate 2, so that the outer control circuit (not shown) controls the drive ICs of the gate driving portion 3a and the data driving portion 3b. The outer control circuit (not shown) applies signals to the gate and data driving portions 3a and 3b through the signal input terminals 12.

As stated above, the gate driving portion 3a and the data driving portion 3b includes drive ICs having a CMOS (complementary metal-oxide-semiconductor) transistor as an inverter which changes a direct current into an alternating current. The CMOS transistor comprises an n-channel MOS transistor, in which electrons are the majority carriers, and a p-channel MOS transistor, in which holes are the majority carriers. Therefore, in n-channel MOS transistor, most of the current is carried by negatively charged electrons and in p-channel MOS transistor, most of the conduction is carried by positively charged holes.

The thin film transistor "T" of the image portion 4 and CMOS transistor (not shown) of the driving portion 3 use polycrystalline silicon as an active layer, and thus can be formed on the same substrate 2.

FIGS. 2A and 2B are cross-sectional views showing conventional thin film transistors posited in an image portion and in a driving portion, respectively. The thin film transistors have a top-gate type structure in which a gate electrode is formed on a semiconductor film.

In FIG. 2A, i.e., in the image portion, a buffer layer 14 is formed on a transparent substrate 1. A semiconductor layer 16 is formed on the buffer layer 14, and the semiconductor layer 16 consists of four portions, i.e., an active layer 16a in the middle of the semiconductor layer 16, source and drain regions 16c and 16d in both ends of the semiconductor layer 16, and lightly doped drain (LDD) region 16b disposed between the active layer 16a and the source region 16c or the active layer 16a and the drain region 16d. The LDD region 16b includes impurities of low density and prevents leakage current of an off-state, that is, applying reverse bias to thin film transistor. A gate insulator 18 is formed on the active layer 16a and a gate electrode 20 is formed on the gate insulator 18. An inter layer insulator 24 is formed the gate electrode 20 and covers the gate electrode 20. The inter layer insulator 24 has first and second contact holes 22a and 22b exposing the source and drain regions 16c and 16d, respectively. Next, source and drain electrodes 26 and 28 are formed on the inter layer insulator 24, and the source and drain electrodes 26 and 28 are connected to the source and drain regions 16c and 16d through the first and second contact holes 22a and 22b, respectively. A passivation layer 32 is formed on the source and drain electrodes 26 and 28, and covers the source and drain electrodes 26 and 28. The passivation layer 32 has third contact hole 30 exposing the drain electrode 28. A pixel electrode 34 is formed on the passivation layer 32 and the pixel electrode 34 contacts the drain electrode 28 through the third contact hole 30 of the passivation layer 32.

The source and drain regions 16c and 16d of FIG. 2A include donor impurities from group V of the periodic table and most of current is carried by electrons. Accordingly, the thin film transistor "A" of FIG. 2A is n-channel MOS transistor.

As shown in FIG. 2B, CMOS transistor in the driving portion comprises n-channel MOS transistor "B" and p-channel MOS transistor "C". In FIG. 2B, a buffer layer 14 is formed on a transparent substrate 1. Next, semiconductor layers 40 and 42 are formed on the buffer layer 14. The semiconductor layer 40 of the n-channel MOS transistor "B" consists of four portions, i.e., an active layer 40a in the middle of the semiconductor layer 40, $n^+$ source and drain regions 40c and 40d in both ends of the semiconductor layer 40, and lightly doped drain (LDD) region 40b disposed between the active layer 40a and the $n^+$ source region 40c or the active layer 40a and the $n^+$ drain region 40d. On the other hand, the p-channel MOS transistor "C" is not much affected by hot carrier and leakage current compared with the n-channel MOS transistor "B". Therefore, semiconductor layer 42 of the p-channel MOS transistor "C" comprises three portions of an active layer 42a, a $p^+$ source region 42b, and a $p^+$ drain region 42c. Gate insulators 44a and 44b are formed on the active layers 40a and 42a. Gate electrodes 46a and 46b are formed on the gate insulators 44a and 44b. An inter layer insulator 24 is formed the gate electrodes 46a and 46b and covers the gate electrodes 46a and 46b. The inter layer insulator 24 has first to fourth contact holes 47a, 47b, 47c and 47d exposing the source and drain regions 40c, 40d, 42b and 42c, respectively. Next, source and drain electrodes 50a, 52a, 50b and 52b are formed on the inter layer insulator 24, and the source and drain electrodes 50a, 52a, 50b and 52b are connected to the source and drain regions 40c, 40d, 42b and 42c through the first to fourth contact holes 47a, 47b, 47c and 47d, respectively. A passivation layer 32 is formed on the source and drain electrodes 50a, 52a, 50b and 52b, and covers the source and drain electrodes 50a, 52a, 50b and 52b.

A manufacturing process of the conventional thin film transistors will be described in detail with reference to the attached FIG. 3.

FIG. 3 is a flow chart showing the process of manufacturing a conventional array substrate including the thin film transistors.

In the first step, an insulating substrate is prepared (ST1). The insulating substrate is made of transparent material such as glass. Here, a buffer layer is formed on the insulating substrate to about a thickness of 3,000 Å. The buffer layer is formed of an inorganic material such as silicon nitride (SiNx) and silicon oxide (SiO$_2$).

In the second step, semiconductor layers are formed (ST2). First, amorphous silicon is deposited on the insulating substrate having the buffer layer to about a thickness of about 550 Å. After the deposited amorphous silicon passes through a dehydrogenation step, the dehydrogenated amorphous silicon is crystallized into polycrystalline silicon by a laser. Then, the polycrystalline silicon is patterned by using a first mask and the semiconductor layers are formed.

In the next step, gate insulators and gate electrodes are formed (ST3). At this time, a silicon nitride of about 800 Å is deposited on the substrate having the semiconductor layers thereon and a refractory metal such as molybdenum (Mo) is deposited on the silicon nitride to a thickness of about 2,000 Å. Continuously, the silicon nitride and the molybdenum are patterned through a second mask process, and gate insulators and gate electrodes are formed on the semiconductor layers.

In the following step, $n^+$ source and drain regions are formed (ST4). Here, lightly doped drain (LDD) regions are also formed. $N^-$ ions are injected into one exposed semiconductor layer using the gate electrode as a mask. Continuously, a photoresist pattern, which covers the gate electrode and the $n^-$ ion doped semiconductor layer near the gate electrode, is formed through a third mask process and $n^+$ ions are subsequently injected into the semiconductor layer, which is not covered with the photoresist pattern. At this time, a photoresist pattern entirely covers the other semiconductor layer. The $n^+$ ions doped semiconductor layers are $n^+$ source and drain regions, and the $n^-$ doped semiconductor layers are LDD regions. Here, the semiconductor layer, which does not include ions, becomes an active layer. Next, the photoresist patterns are removed.

In the next step, $p^+$ source and drain regions are formed (ST5). $P^+$ ions are injected into the other exposed semiconductor layer using the gate electrode as a mask. At this moment, a photoresist pattern is formed on the semiconductor of ST4 through a fourth mask process and entirely covers the semiconductor. The $p^+$ ions doped semiconductor layers are $p^+$ source and drain regions, and the semiconductor layer, which does not include ions, becomes an active layer. Then, the photoresist pattern is removed.

Next, an inter layer insulator is formed (ST6). The inter layer insulator is made of an inorganic material such as silicon nitride and silicon oxide, and has a thickness of about 7,000 Å. The inter layer insulator is patterned through a fifth mask process and contact holes, which exposes the source and drain regions, are formed.

In the following step, source and drain electrodes are formed (ST7). Metals, such as molybdenum (Mo) and aluminum-neodymium (AlNd) are sequentially deposited on the inter layer insulator about 500 Å and about 3,000 Å thick, respectively. The Mo and AlNd are etched through a sixth mask process, and source and drain electrodes, which are connected to the source and drain regions through the contact holes, are formed.

In the next step, a passivation layer is formed (ST8). Silicon nitride is deposited to about 4,000 Å on the substrate having source and drain electrodes thereon. After the silicon nitride is annealed, the silicon nitride is patterned through a seventh mask process, and so a drain contact hole is formed. The drain contact hole exposes the drain electrode of the image portion. The annealing process is accomplished at about 380 degrees Celsius in a nitrogen atmosphere. For the annealing process, hydrogen within the passivation layer is driven downward.

In the last step, a pixel electrode is formed (ST9). The pixel electrode exists only in the image portion. A transparent conducting material, such as indium-tin-oxide (ITO), is deposited on the passivation layer. The transparent conducting material is patterned through an eighth mask process, and so the pixel electrode, which contacts the drain electrode through the drain contact hole, is formed.

In the above process, steps of forming $n^+$ source and drain regions and $p^+$ source and drain regions are illustrated in FIGS. 4A to 4C and FIGS. 5A to 5C. FIGS. 4A to 4C are cross-sectional views of a manufacturing process of thin film transistor formed in a first region "A" of the image portion and FIGS. 5A to 5C are cross-sectional views of a manufacturing process of thin film transistors formed in second and third regions "B" and "C" of the driving portion.

As shown in FIGS. 4A and 5A, an n⁻ ion doping is accomplished on the substrate 1, which includes semiconductor layer 16, 40 and 42, gate insulators 18, 44a and 44b, and gate electrodes 20, 46a and 46b in each region, using gate electrodes 20, 46a and 46b as mask. Here, n⁻ ions are injected into the exposed semiconductor layer 16e, 40e and 42e. The center portions of the semiconductor layers, which do not include impurities, become active layers 16a, 40a and 40b.

In FIGS. 4B and 5B, first photoresist patterns 21, 47 and 48 are formed using a photolithography process. The first photoresist patterns 21 and 47 of the first region "A" and the second region "B" cover the gate electrodes 20 and 46a and the n⁻ ion doped semiconductor layers 16e of FIG. 4A and 40e of FIG. 5A near by the gate electrodes 20 and 46a while the first photoresist pattern 48 of the third region "C" covers the gate electrode 46b and all the semiconductor layer 42a and 42e. Subsequently, n⁺ ion doping, having higher density than n⁻ ion doping of FIGS. 4A and 5A, is performed on the substrate 1, and the exposed semiconductor layers result in n⁺ source and drain regions 16c, 16d, 40c and 40d including n⁺ ions. The covered n⁻ doped semiconductor layers become lightly doped drain (LDD) regions 16b and 40b. After that, the first photoresist patterns 21, 47 and 48 are removed.

Next, in FIGS. 4C and 5C, second photoresist patterns 22 and 49 are formed through another photolithography process. The second photoresist pattern 22 of the first region "A" covers the gate electrode 20, the n⁺ source and drain regions 16c and 16d, and the LDD region 16b. The second photoresist pattern 49 of the second region "B" covers the gate electrode 46a, the n⁺ source and drain regions 40c and 40d, and the LDD region 40b. And p⁺ ion doping is carried out, using the second photoresist patterns 22 and 49 as mask. Then, p⁺ ions are injected into the exposed semiconductor layer, and p⁺ source and drain regions 42b and 42c are formed. The second photoresist patterns 22 and 49, subsequently, are removed.

As stated before, two photolithography processes are required in order to form conventional CMOS thin film transistors, which is composed of n-channel MOS transistor and p-channel MOS transistor. The photolithography process includes several steps of coating photoresist, exposing through a mask and developing the photoresist. Therefore, as photolithography processes are added, fabricating time, costs, and failure may be increased.

On the other hand, polycrystalline silicon is used as the active layers in the above thin film transistors. Polycrystalline silicon can be formed by depositing amorphous silicon on a substrate, such as by plasma enhanced chemical vapor deposition (PECVD) or low-pressure chemical vapor deposition (LPCVD), and then crystallizing that amorphous silicon into polycrystalline silicon. There are a number of different methods of crystallizing amorphous silicon into polycrystalline silicon, including solid phase crystallization (SPC), metal induced crystallization (MIC), and laser annealing.

However, polycrystalline silicon formed by the above methods has a lot of crystal grains and grain boundaries. These grains and boundaries interrupt the carrier movement and cause the deterioration of the device. Further, if the grains are larger and the grain boundaries are regularly distributed within the polycrystalline silicon, the field effect mobility becomes larger. In view of these grains and grain boundaries, a silicon crystallization method that produces large grains is important.

Recently, a new method of crystallization, often referred to as sequential lateral solidification (SLS), has been researched. The SLS method takes advantage of the fact that silicon grains grow laterally from the boundary between liquid phase silicon and solid phase silicon. The SLS method can increase the size of the silicon grains that grow by controlling the energy intensity of a laser beam and the irradiation range of the laser beam (reference, Robert S. Sposilli, M. A. Crowder, and James S. Im, Mat. Res. Soc. Symp. Proc. Vol. 452, 956~957, 1997). This enables thin film transistors having channel areas of single crystalline silicon.

FIG. 6 is a graph showing a grain size in accordance with the energy density of laser beam, and FIGS. 7A to 7C are cross-sectional views of the silicon films for explaining the mechanism of forming polycrystalline silicon film composed of grains depending on the energy density of laser beam. The energy density of a laser beam for each region depends on the laser apparatus used. As shown in FIGS. 7A to 7C, a buffer layer 102 and an amorphous silicon layer 104 are sequentially formed on a transparent substrate 100 before the laser beam irradiating process.

A first region of FIG. 6 is a partial melting regime. When the laser beam having the energy density of a first region is irradiated on the amorphous silicon layer 104, only a surface portion "S" of amorphous silicon layer 104 is melted as shown in FIG. 7A. Thereafter, during the annealing process, a plurality of small grains "G1" are formed in a vertical direction from the lower part of the amorphous silicon layer 104.

A second region of FIG. 6 is a near-complete melting regime. When the laser beam having the energy density of a second region is irradiated on the amorphous silicon layer 104, almost all of the amorphous silicon is melted, as shown in FIG. 7B, and a plurality of seeds 103 are formed between the amorphous silicon layer 104 and the buffer layer 102. Due to the plurality of seeds 103, the silicon grains tend to grow horizontally. However, since the plurality of seeds 103 are distributed randomly over the transparent substrate 100, it is very difficult to obtain a plurality of grains "G2" uniformly although the grains "G2" are rather large.

A third region of FIG. 6 is a complete melting regime. When the laser beam having the energy density of a third region is irradiated on the amorphous silicon layer 104, all of the amorphous silicon is melted as shown in FIG. 7C. Then, a homogeneous nucleation is conducted during the annealing process. Therefore, a plurality of nuclei 105 are formed in the melted silicon, and fine grains "G3" are finally obtained.

The above-mentioned SLS method uses the energy density of laser beam corresponding to the third region of FIG. 6. A mechanism of the formation of single crystalline silicon by the SLS method will be described with reference to the attached FIGS. 8A to 8C. FIGS. 8A to 8C are plane views showing processes of manufacturing single crystalline silicon by the conventional SLS method.

In FIG. 8A, when a laser beam having the energy density of the third region of FIG. 6 is irradiated on the first region "M1" of an amorphous silicon layer 104, the first region "M1" is completely melted. Here, amorphous silicon 107 in a non-irradiated region, more particularly at the boundary of the first region "M1", acts as a seed owing to lower energy density than in the first region "M1". Accordingly, crystallization starts from the boundary of the first region "M1", so that first grains 106a are formed in the first region "M1".

Next, as shown in FIG. 8B, a laser beam having the same energy density as that in FIG. 8A is irradiated on the second region "M2", which may include a part of the first region "M1" of FIG. 8A, and the second region "M2" is entirely melted. The first grains 106a formed in FIG. 8A act as a seed in this step, and the second grains 106b, which have a larger size than the first grains 106a, are formed by growing laterally from the first grains 106a.

In FIG. 8C, a laser beam having the same energy density as that in FIGS. 8A and 8B is irradiated on the third region "M3", which may include a part of the second region "M2" of FIG. 8B, and then the third region "M3" is completely melted. Here, the second grains 106b formed in the previous step act as a seed of this step. Therefore, crystallization starts from the second grains 106b in a lateral direction and the third grains 106c, which have a much larger size than the second grains 106b, are formed.

When silicon crystallized by this method is used as an active layer of thin film transistor, the crystallized silicon is single crystalline silicon, and the growing direction of the crystallized silicon is in accord with the channel direction, that is, the current path of thin film transistor. Therefore, electrical characteristics of the thin film transistor, which has the single crystalline silicon, are improved.

SUMMARY OF THE INVENTION

Accordingly, the present invention is directed to a method of manufacturing an array substrate having drive integrated circuits that substantially obviates one or more of problems due to limitations and disadvantages of the related art.

An advantage of the present invention is to provide a method of manufacturing an array substrate that increases productivity because of the shorter processes and the lower cost.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing an array substrate having drive integrated circuits includes forming first and second semiconductor layers on a substrate, wherein the first and second semiconductor layers are made of single crystalline silicon; depositing an insulating material on the first and second semiconductor layers; depositing a metal on the insulating material; forming first photoresist patterns on the metal, wherein the first photoresist patterns are over the first and second semiconductors; forming first and second gate electrodes over the first and second semiconductor layers, respectively, by etching the metal, wherein the first and second gate electrodes are narrower than the first photoresist patterns; forming first and second insulator patterns on the first and second semiconductor layers, respectively, by etching the insulating material, wherein the first and second insulator patterns have substantially the same widths as the first photoresist patterns; doping $n^+$ ions by using the first photoresist patterns as a first doping mask; ashing the first photoresist patterns, thereby the first photoresist patterns becoming a reduced first photoresist patterns, wherein the reduced first photoresist patterns have substantially the same width as the first and second gate electrodes; etching the first and second insulator patterns by using the reduced first photoresist patterns as an etching mask; doping $n^-$ ions by using the reduced first photoresist patterns as a second doping mask; removing the reduced first photoresist patterns after the doping $n^-$ ions; forming a second photoresist pattern, which covers the first gate electrode and the first semiconductor layer; doping $p^+$ ions by using the second photoresist pattern and the second gate electrode as a third doping mask; and removing the second photoresist pattern after doping $p^+$ ions.

In another aspect, a method of manufacturing an array substrate having drive integrated circuits includes forming first and second semiconductor layers on a substrate, wherein the first and second semiconductor layers are made of single crystalline silicon; depositing an insulating material on the first and second semiconductor layers; depositing a metal on the insulating material; forming first photoresist patterns on the metal, wherein the first photoresist patterns are over the first and second semiconductors; forming first and second gate electrodes over the first and second semiconductor layers, respectively, by etching the metal, wherein the first and second gate electrodes are narrower than the first photoresist patterns; doping $n^+$ ions by using the first photoresist patterns as a first doping mask; removing the first photoresist patterns; doping $n^-$ ions by using the first and second gate electrodes as a second doping mask; forming a second photoresist pattern, which covers the first gate electrode and the first semiconductor layer; doping $p^+$ ions by using the second photoresist pattern and the second gate electrode as a third doping mask; and removing the second photoresist pattern after the doping $p^+$ ions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 9A:
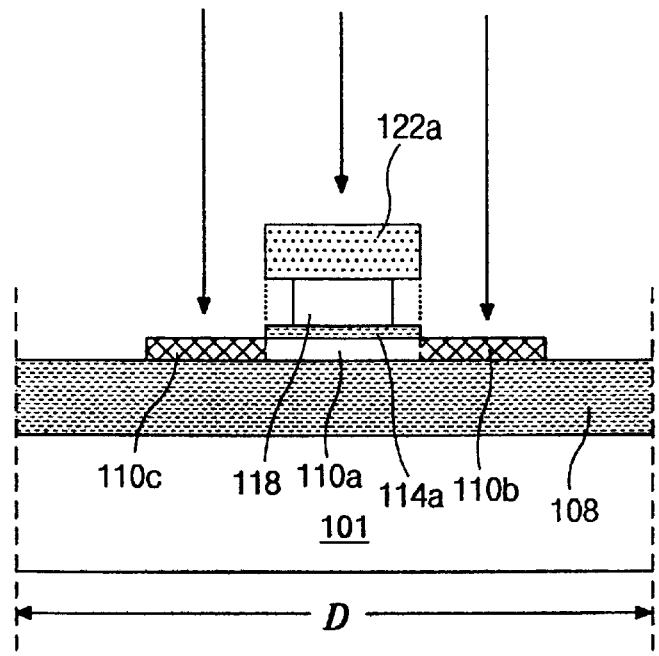
FIGS. 9A to 9C are cross-sectional views of manufacturing process of a thin film transistor in the image portion according to first embodiment of the present invention.
Figure 9B:
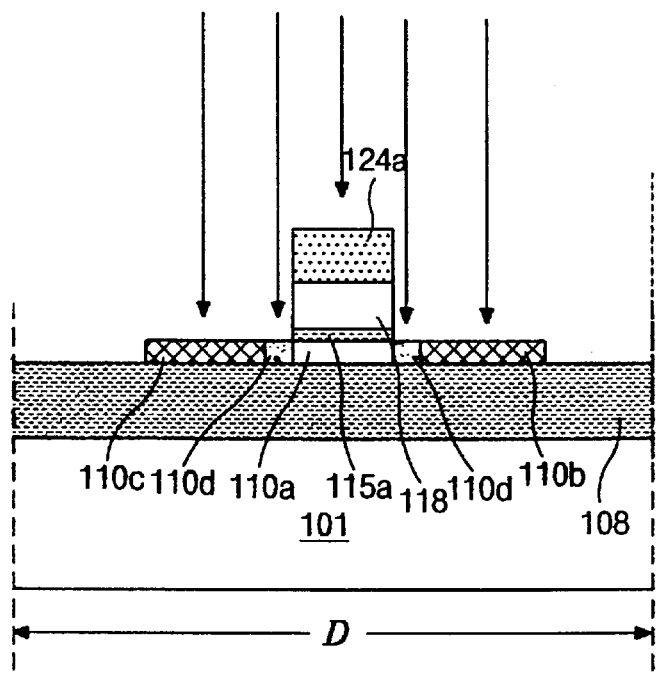
Figure 9C:
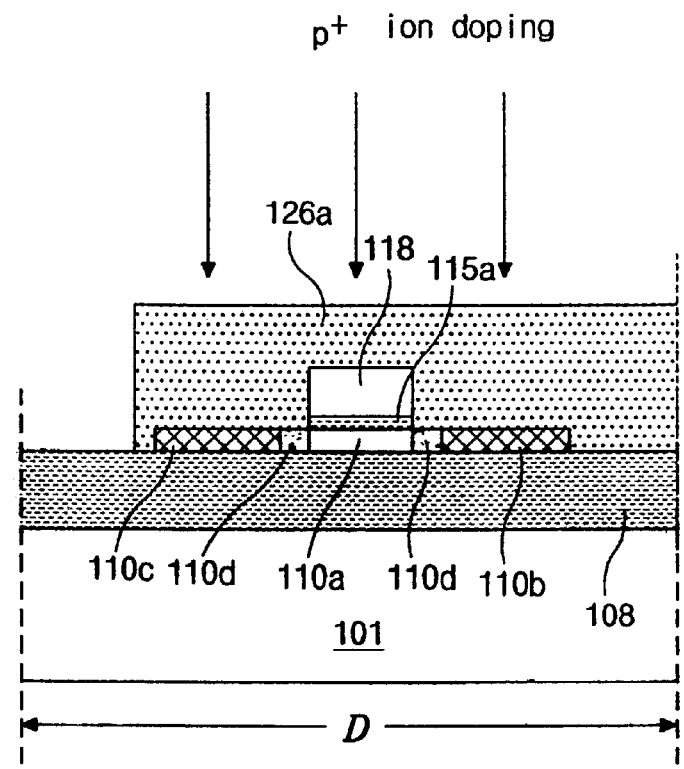
Figure 10A:
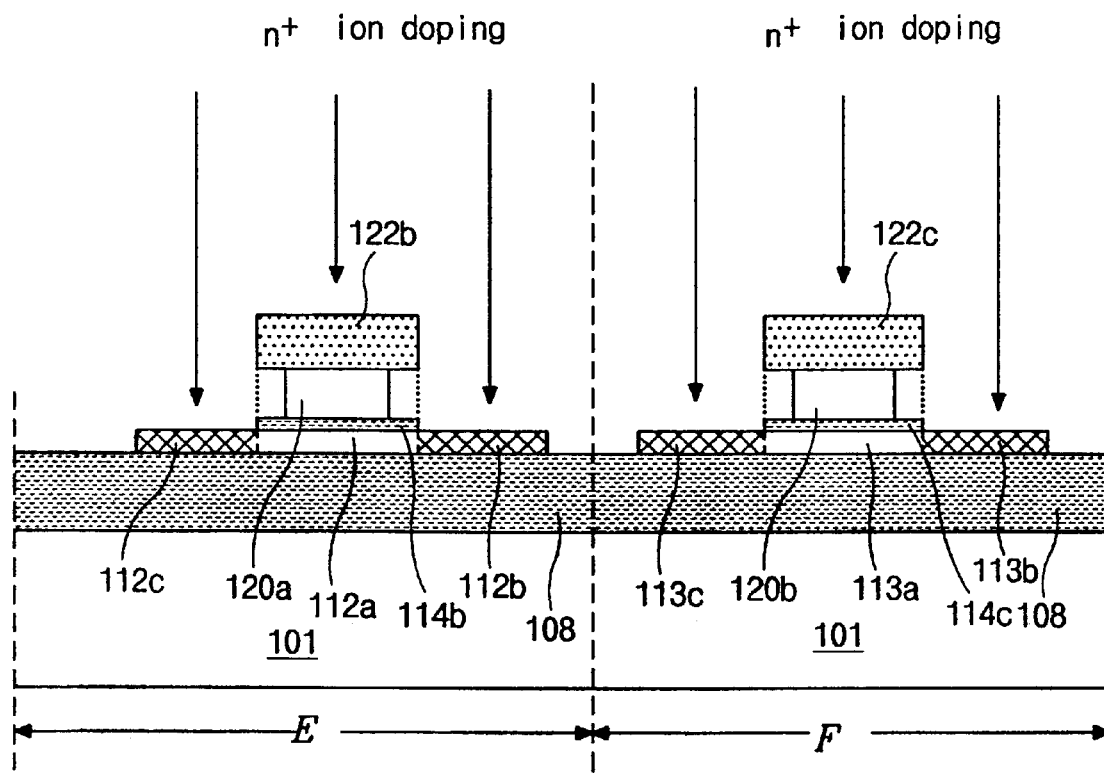
FIGS. 10A to 10C are cross-sectional views of manufacturing process of thin film transistors in the driving portion according to first embodiment of the present invention.
Figure 10B:
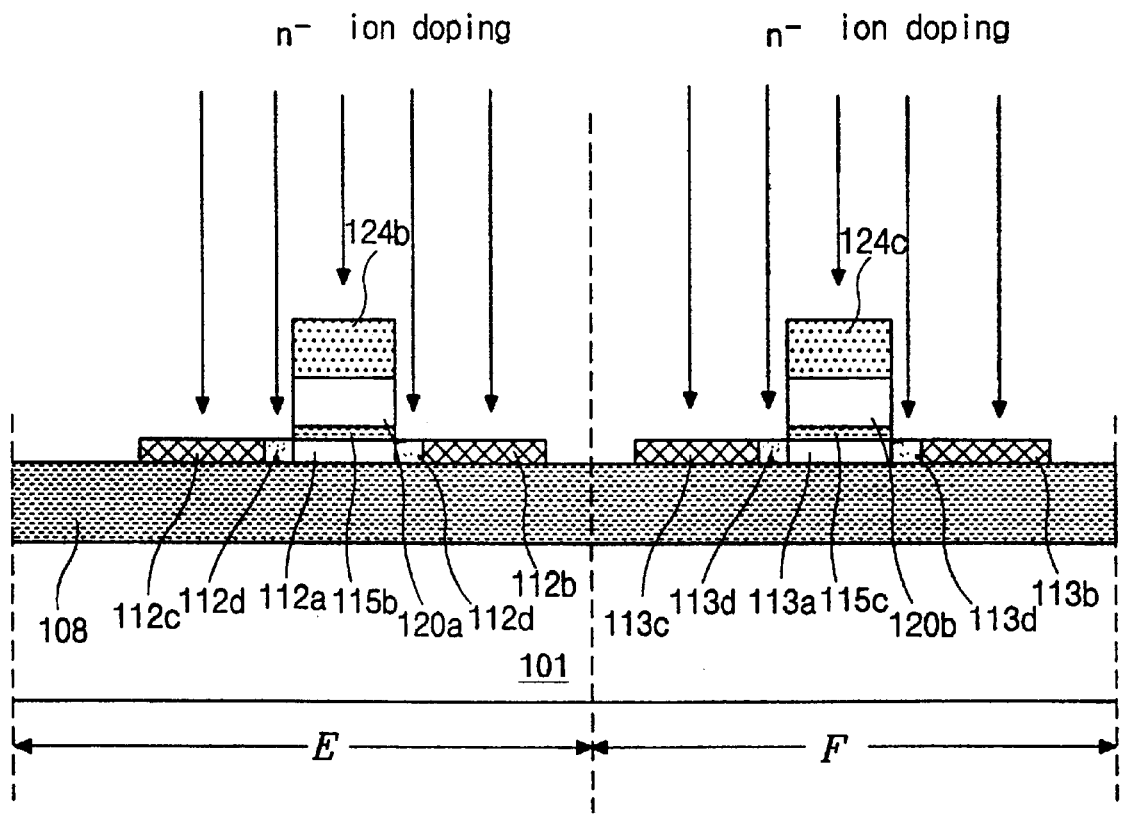
Figure 10C:
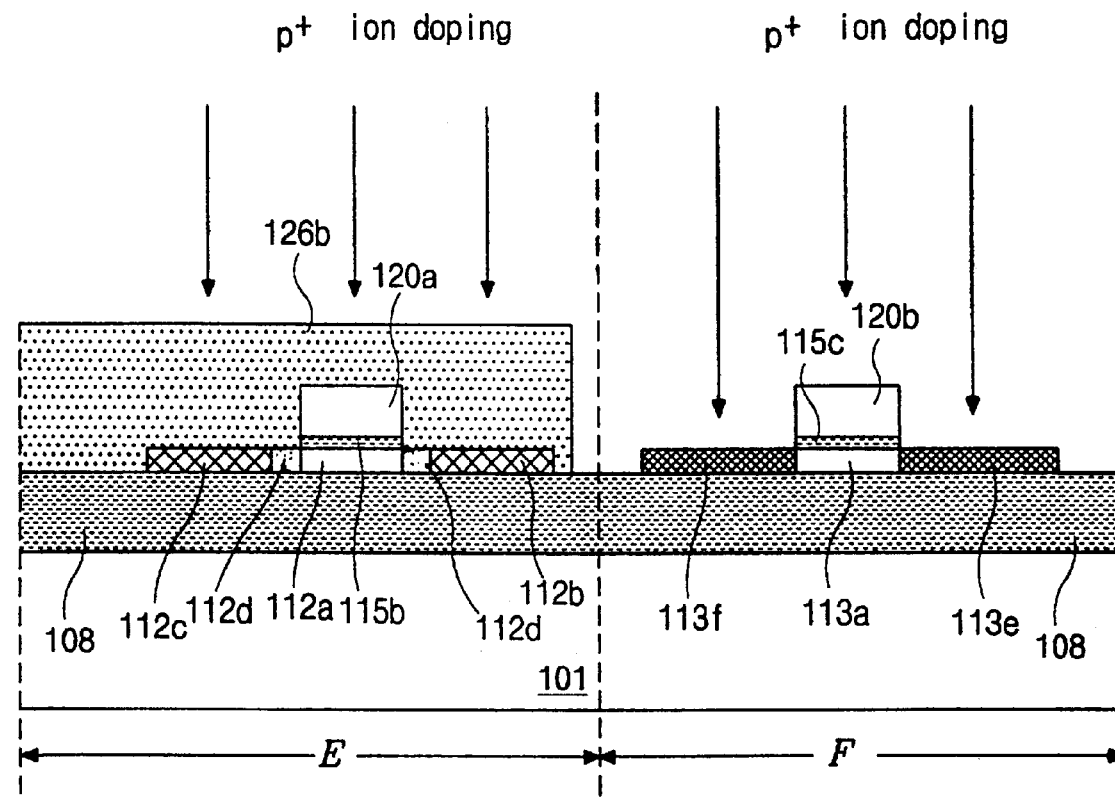

The first embodiment of the present invention is illustrated in FIGS. 9A to 9C and FIGS. 10A to 10C. FIGS. 9A to 9C are cross-sectional views of manufacturing process of thin film transistor in the first region "D" of the image portion according to first embodiment of the present invention. FIGS. 10A to 10C are cross-sectional views of manufacturing process of thin film transistor in the second and third regions "E" and "F" of the driving portion according to first embodiment of the present invention.

As shown in FIGS. 9A and 10A, a buffer layer 108 is formed on a transparent substrate 101 and semiconductor layers are formed on the buffer layer 108. The semiconductor layer is single crystalline silicon and may be formed by the sequential lateral solidification (SLS) method explained above. After an insulating layer and a metal layer are sequentially deposited on the semiconductor layer, the first photoresist patterns 122a, 122b and 122c are formed on the metal layer through a photolithography process of coating photoresist material, exposing and developing the photoresist material. The metal layer and the insulating layer are etched using the first photoresist patterns 122a, 122b and 122c as a mask, and gate electrodes 118, 120a and 120b gate insulator patterns 114a, 114b and 114c are formed. At this time, the gate electrodes 118, 120a and 120b are over-etched because of anisotropic etching properties and because they have a narrower width than the first photoresist patterns 122a, 122b and 122c. The gate insulator patterns 114a, 114b and 114c have a width substantially equal to the first photoresist patterns 122a, 122b and 122c. Subsequently, an $n^{"+}$ ion doping is accomplished on the substrate 101 using the first photoresist patterns 122a, 122b and 122c as a doping mask, and $n^+$ ions are injected into the exposed semiconductor layer 110b, 110c, 112b, 112c, 113b and 113c. Therefore, $n^+$ source and drain regions 110b, 110c, 112b, 112c, 113b and 113c are formed. The number of doped ions per unit area is termed the dose, and the $n^+$ ion dose is desirably about $1\times10^{15}/cm^2$ to $2\times10^{15}/cm^2$. In the prior art, after edges of the first photoresist patterns 122a, 122b and 122c are removed by an ashing process, ion doping is carried out.

In FIGS. 9B and 10B, photoresist patterns 124a, 124b and 124c having substantially the same width as the gate electrodes 118, 120a and 120b are formed by ashing the first photoresist patterns 122a, 122b and 122c of FIGS. 9A and 10A. Then, the gate insulator patterns 114a, 114b and 114c of FIGS. 9A and 10A are etched and gate insulators 115a, 115b and 115c are completed. Next, $n^-$ ion doping, having a dose of about $10^{13}/cm^2$, is performed using the photoresist patterns 124a, 124b and 124c as a doping mask. The $n^-$ ion doped regions 110d, 112d and 113d close to the gate electrodes 118, 120a and 120b become lightly doped drain (LDD) regions. The $n^+$ source and drain regions 110b, 110c, 112b, 112c, 113b and 113c are not affected because the $n^-$ ion dose is much less than the $n^+$ ion dose. After that, the photoresist patterns 124a, 124b and 124c are removed. The center portions 110a, 112a and 113a of the semiconductor layers under the gate electrodes 118, 120a and 120b, do not include impurities and become active layers of thin film transistors.

Figure 1:
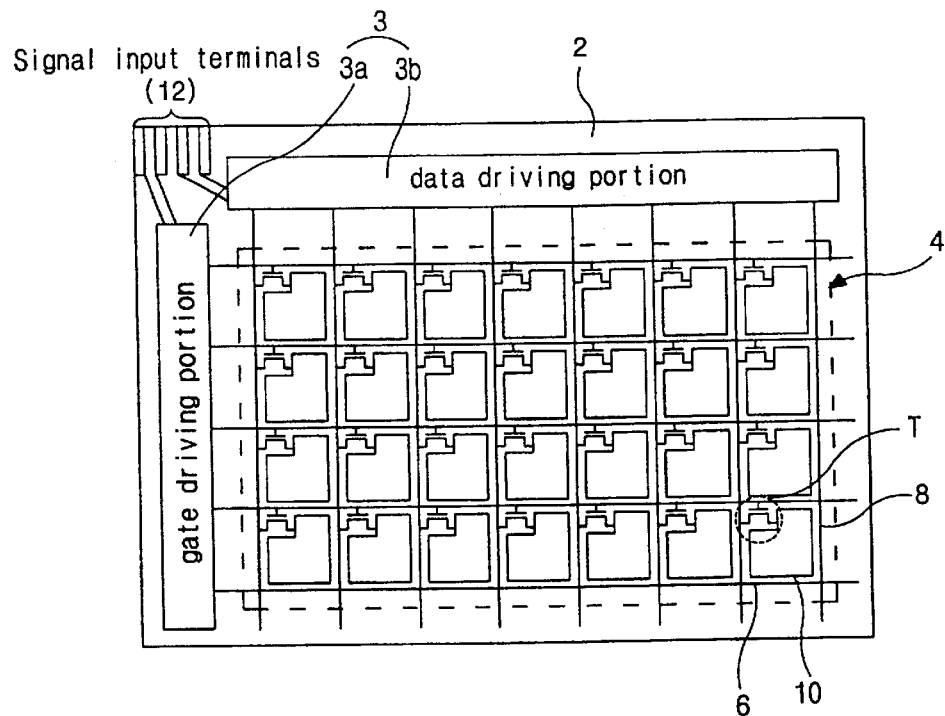
FIG. 1 is a schematic block diagram showing an array substrate of a conventional liquid crystal display (LCD) device having drive integrated circuits.
Figure 2A:
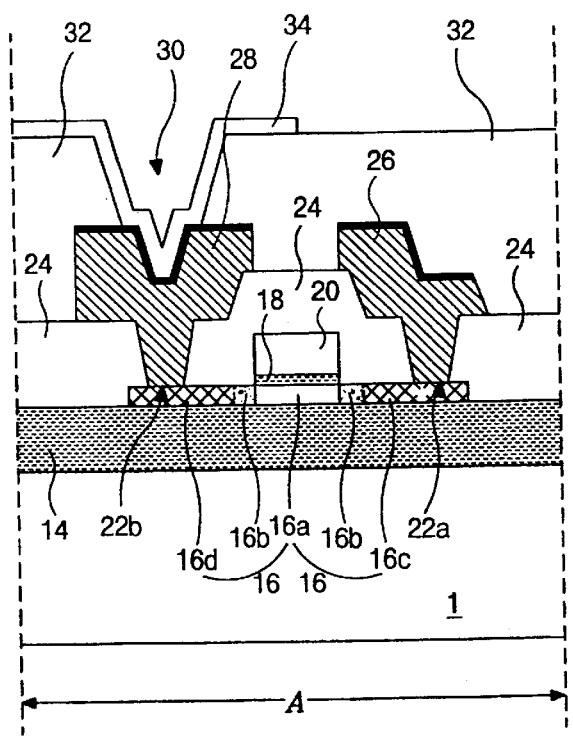
FIGS. 2A and 2B are cross-sectional views of showing conventional thin film transistors.
Figure 2B:
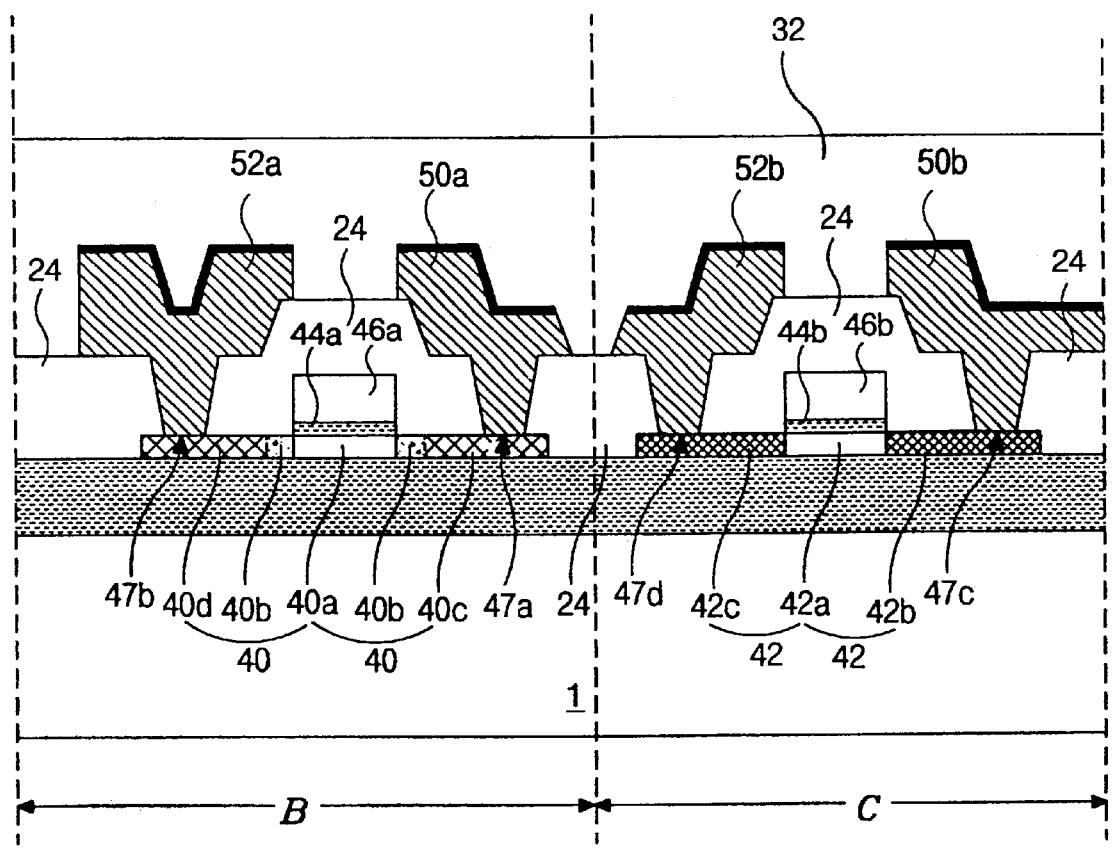
Figure 3:
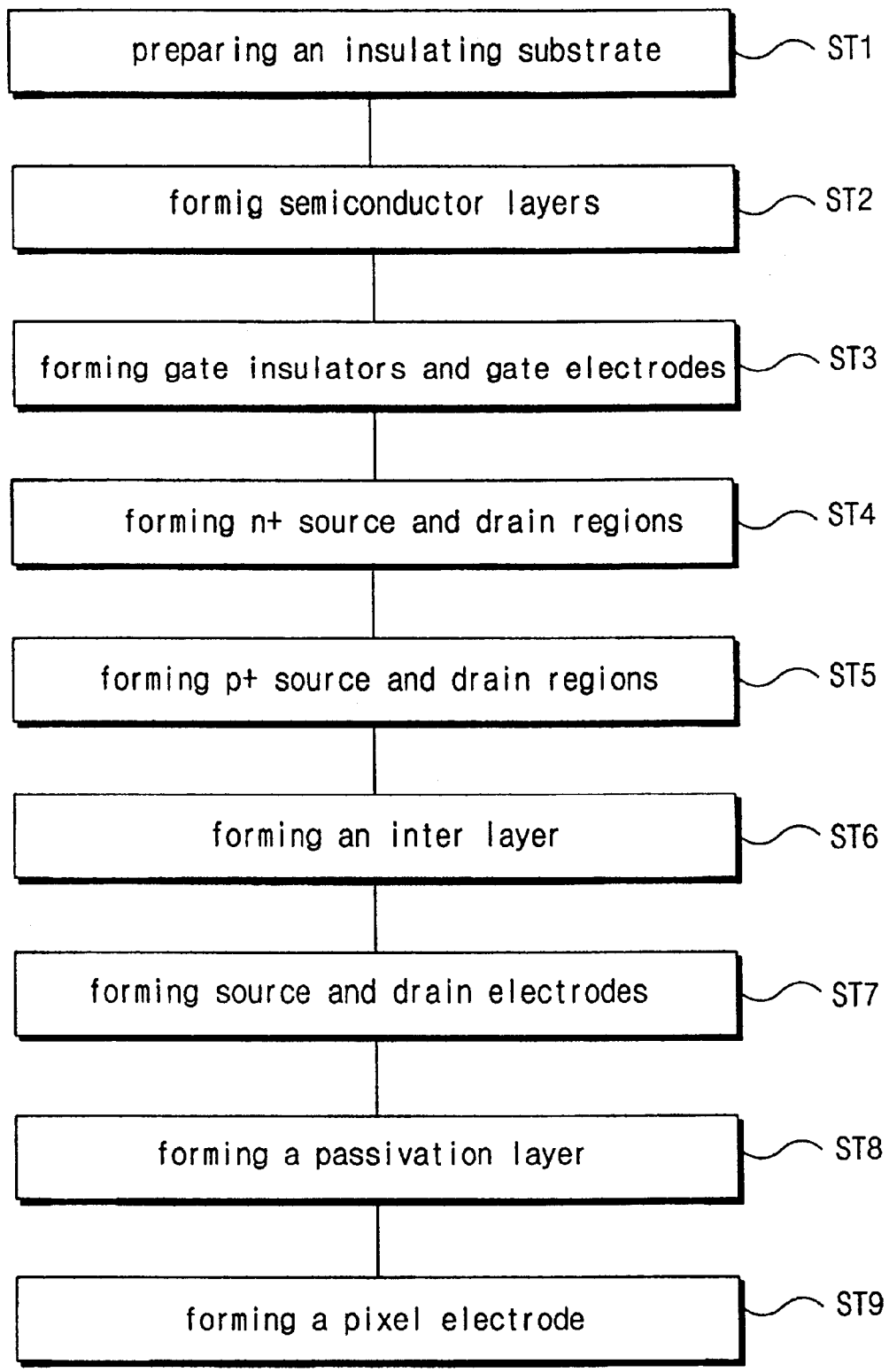
FIG. 3 is a flow chart showing the process of manufacturing a conventional array substrate.
Figure 4A:
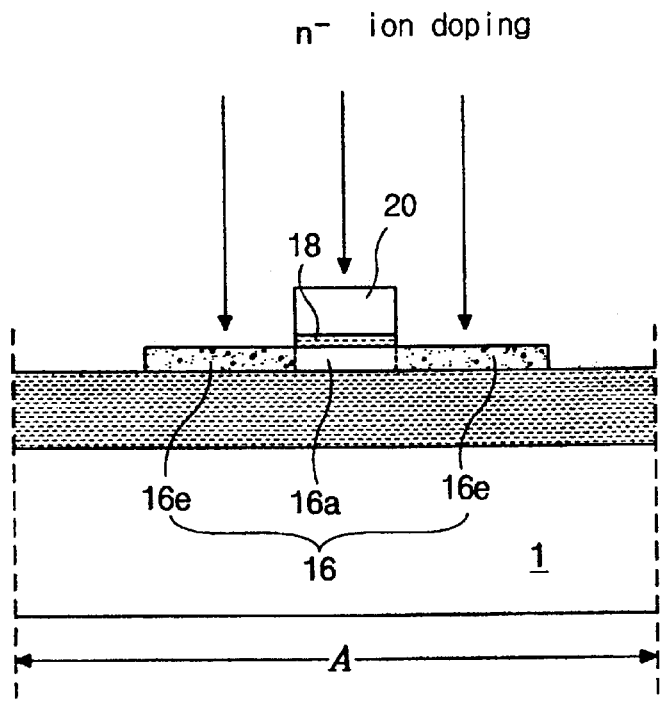
FIGS. 4A to 4C are cross-sectional views of manufacturing process of a thin film transistor formed in the image portion.
Figure 4B:
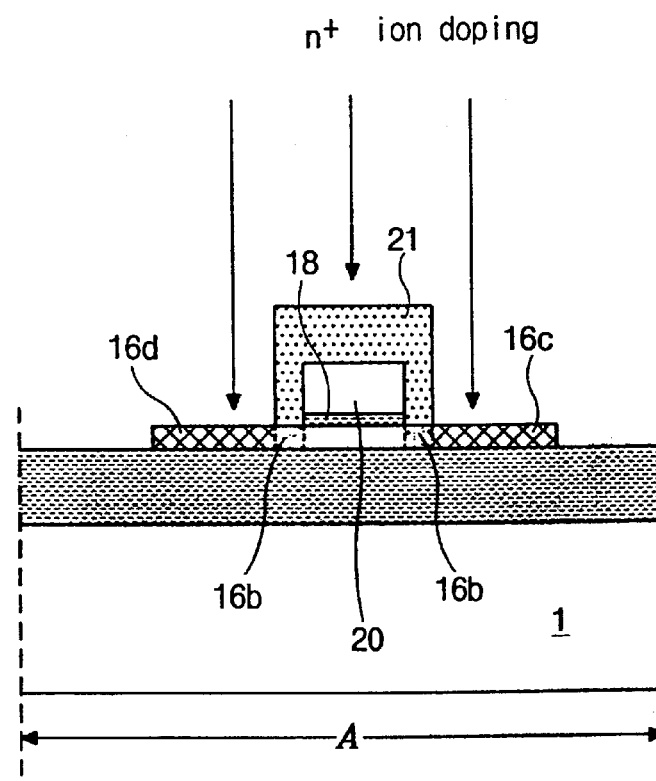
Figure 4C:
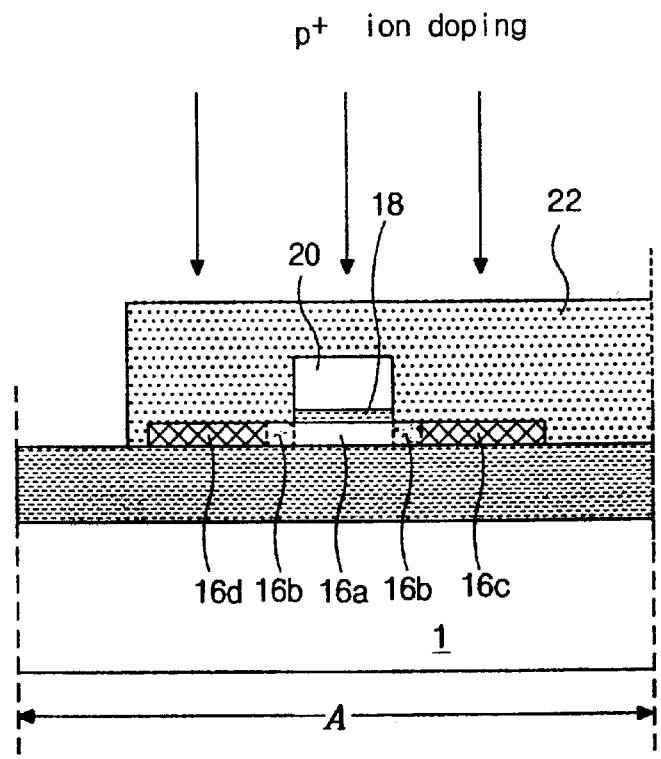
Figure 5A:
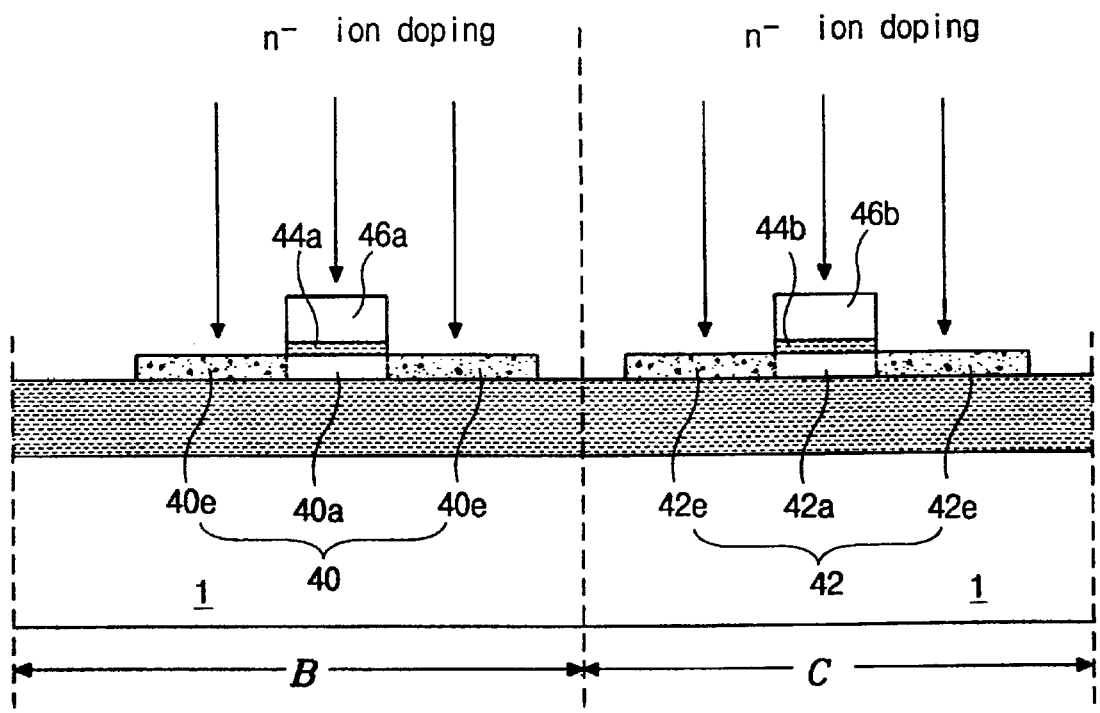
FIGS. 5A to 5C are cross-sectional views of manufacturing process of thin film transistors formed in the driving portion.
Figure 5B:
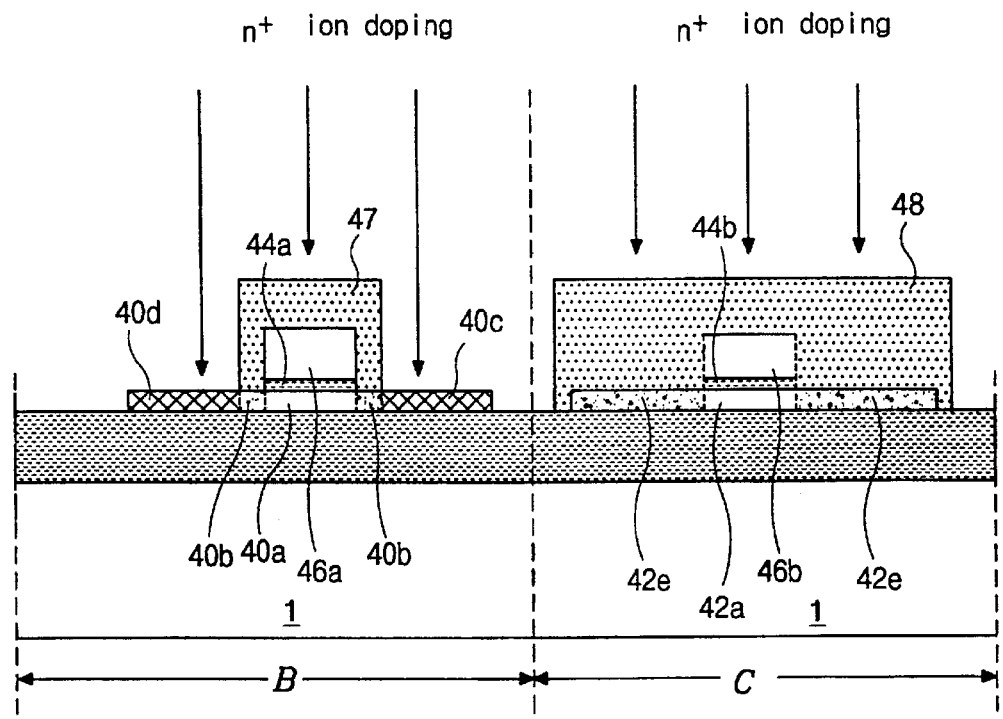
Figure 5C:
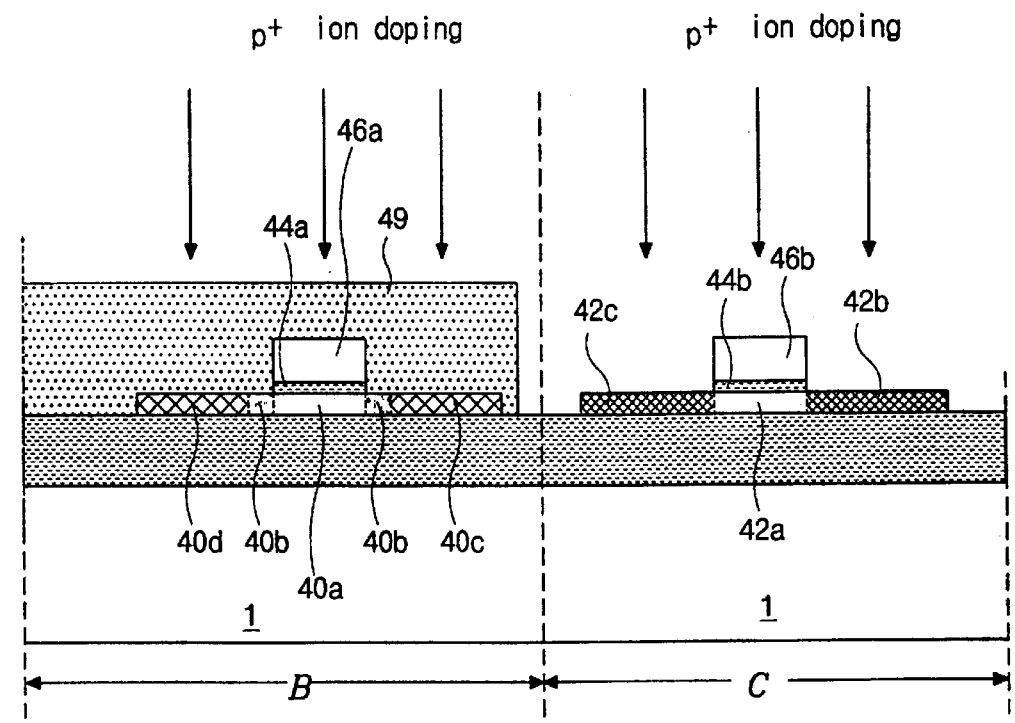
Figure 6:
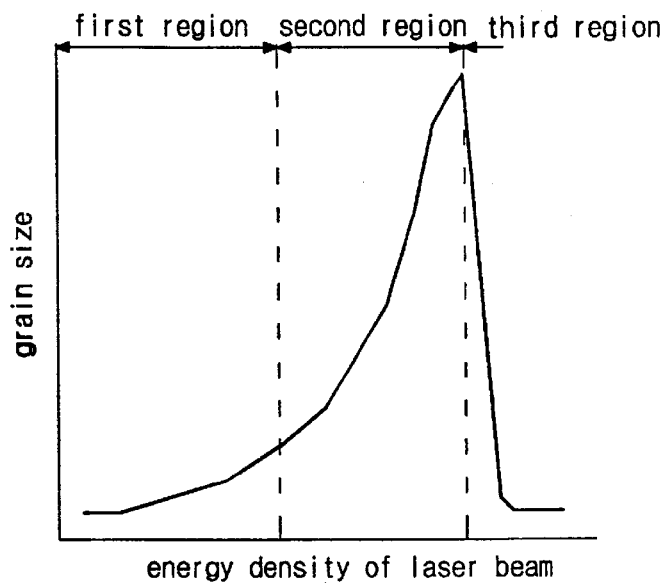
FIG. 6 is a graph showing a grain size in accordance with the energy density of laser beam.
Figure 7A:
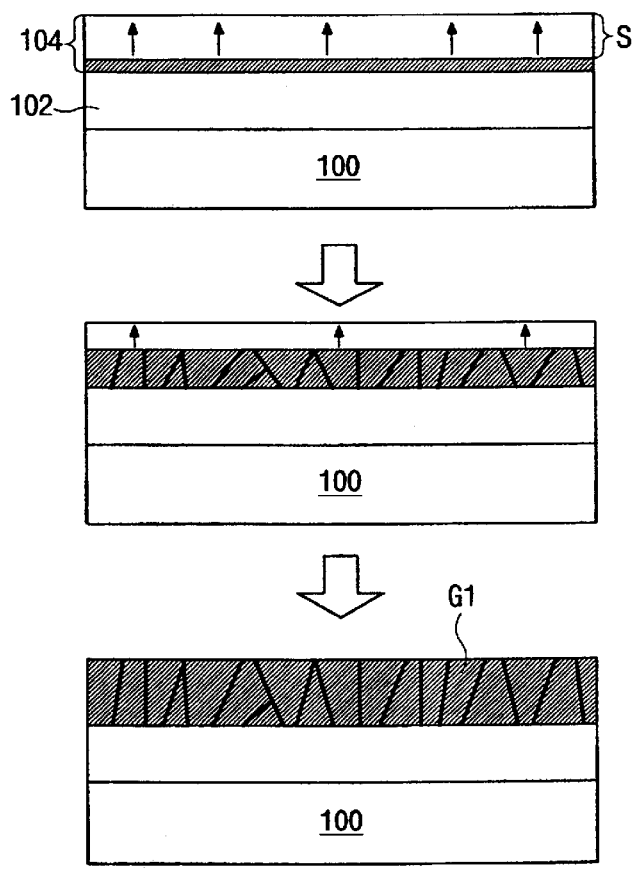
FIGS. 7A to 7C are cross-sectional views of the silicon films for explaining the mechanism of forming polycrystalline silicon film composed of grains depending on the energy density of laser beam.
Figure 7B:
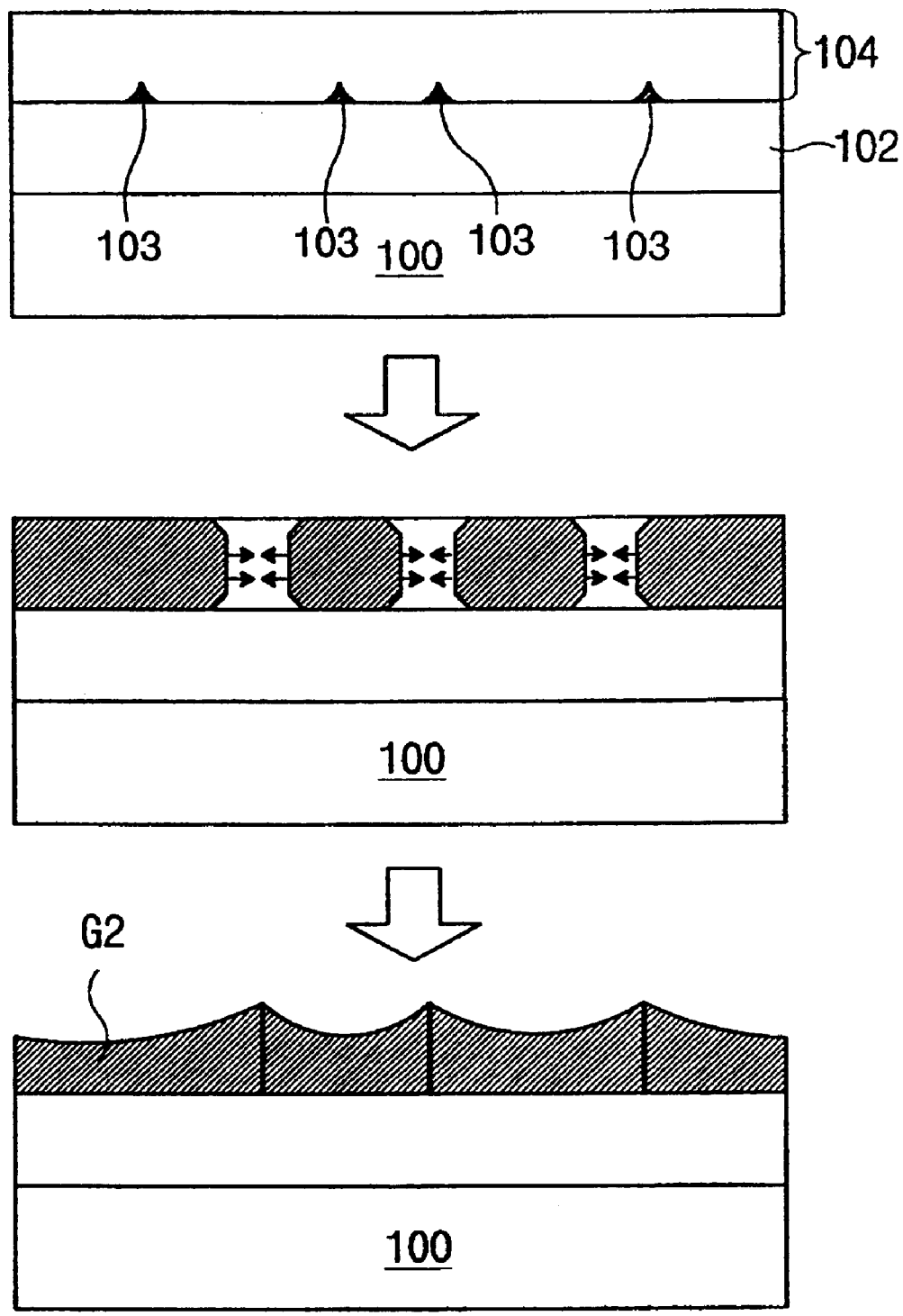
Figure 7C:
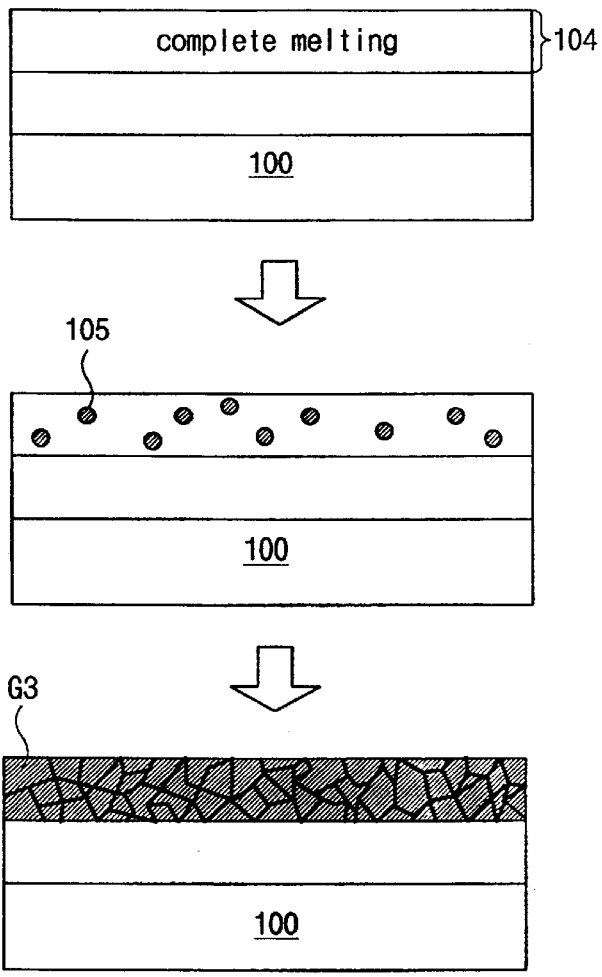
Figure 8A:
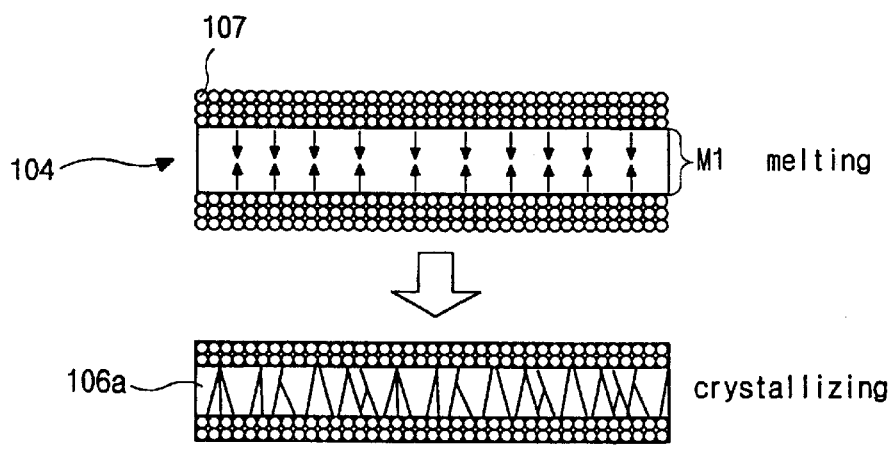
FIGS. 8A to 8C are plan views showing processes of manufacturing single crystalline silicon by a conventional SLS method.
Figure 8B:
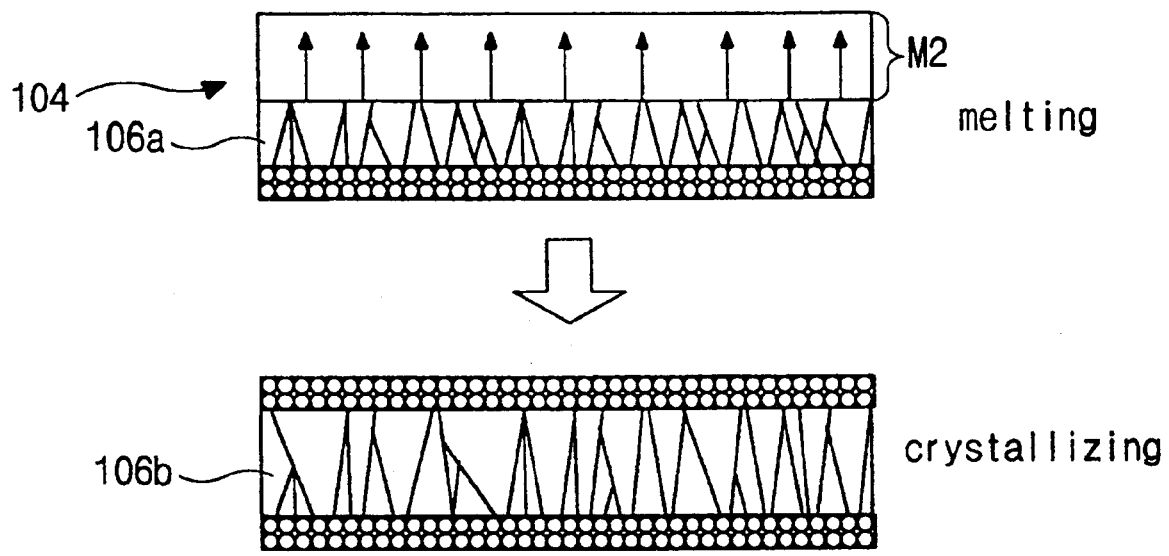
Figure 8C:
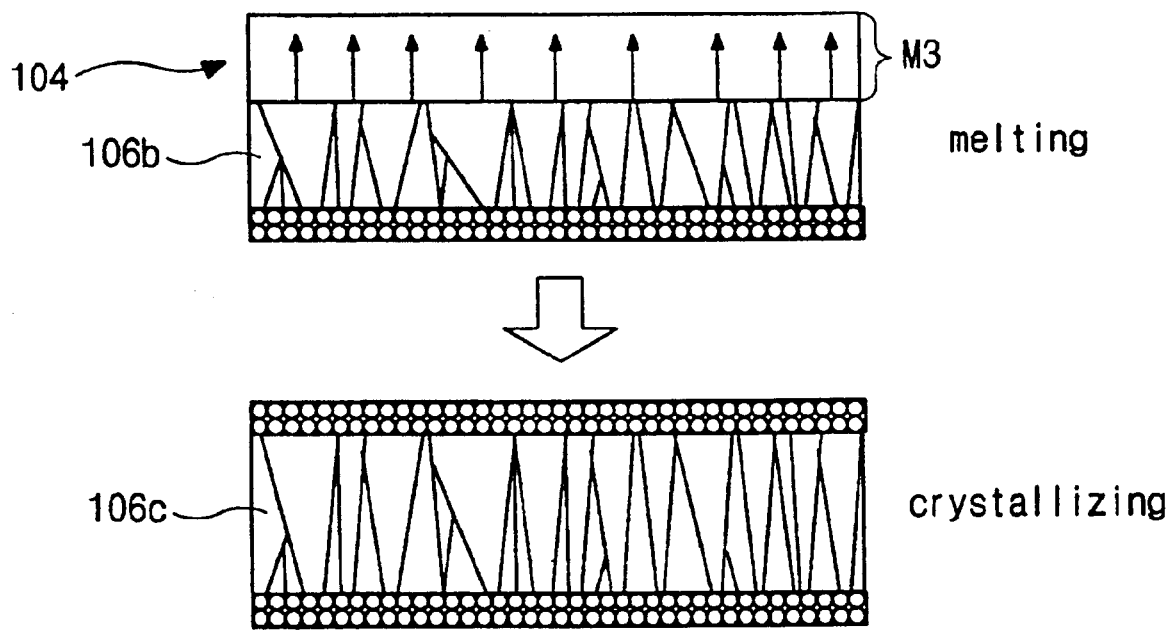

Next, in FIGS. 9C and 10C, the second photoresist patterns 126a and 126b are formed in the first and second regions "D" and "E", respectively, through another photolithography process. The second photoresist pattern 126a of the first region "D" covers the gate electrode 118, the $n^+$ source and drain regions 110b and 110c, and the LDD region 110d. The second photoresist pattern 126b of the second region "E" covers the gate electrode 120a, the $n^+$ source and drain regions 112b and 112c, and the LDD region 112d. And $p^+$ ion doping is carried out using the second photoresist patterns 126a and 126b as a doping mask. Here, the $p^+$ ion dose should be larger than the $n^+$ ion dose. Then, $p^+$ ions are injected into the exposed semiconductor layer of the third region "F", and $p^+$ source and drain regions 113e and 113f are formed due to more $p^+$ ion dose of about $3\times10^{15}/cm^2$ to $4\times10^{15}/cm^2$ compared with the $n^+$ ion dose. The second photoresist patterns 126a and 126b are removed. Subsequently, other processes such as ST5 to ST9 of FIG. 3 will be followed.

As referred to above, only one photolithography process is added in the first embodiment of the present invention.

The second embodiment of the present invention is illustrated in FIGS. 11A to 11D and FIGS. 12A to 12D. FIGS. 11A to 11D are cross-sectional views of a manufacturing process of a thin film transistor in the first region "G" of the image portion according to second embodiment of the present invention. FIGS. 12A to 12D are cross-sectional views of a manufacturing process of thin film transistors in the second and third regions "H" and "I" of the driving portion according to second embodiment of the present invention.

Figure 11A:
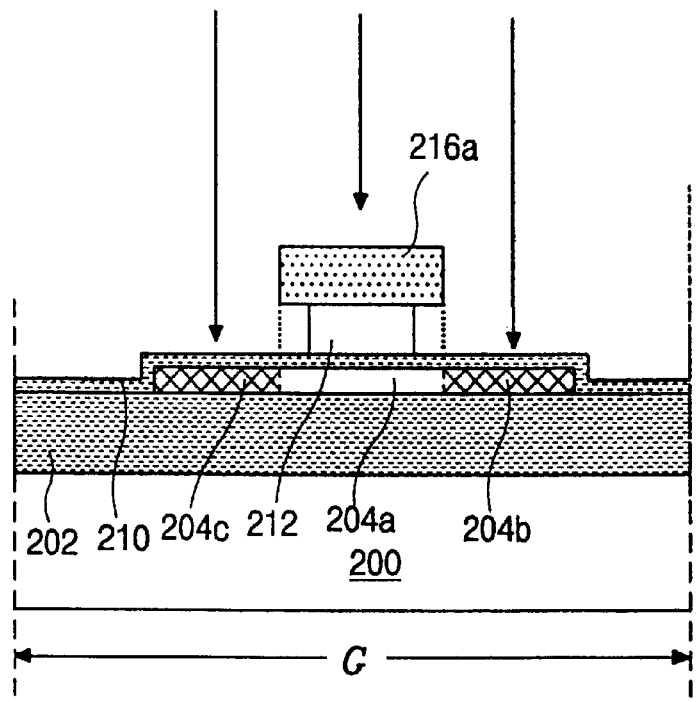
FIGS. 11A to 11D are cross-sectional views of manufacturing process of a thin film transistor in the image portion according to second embodiment of the present invention.
Figure 12A:
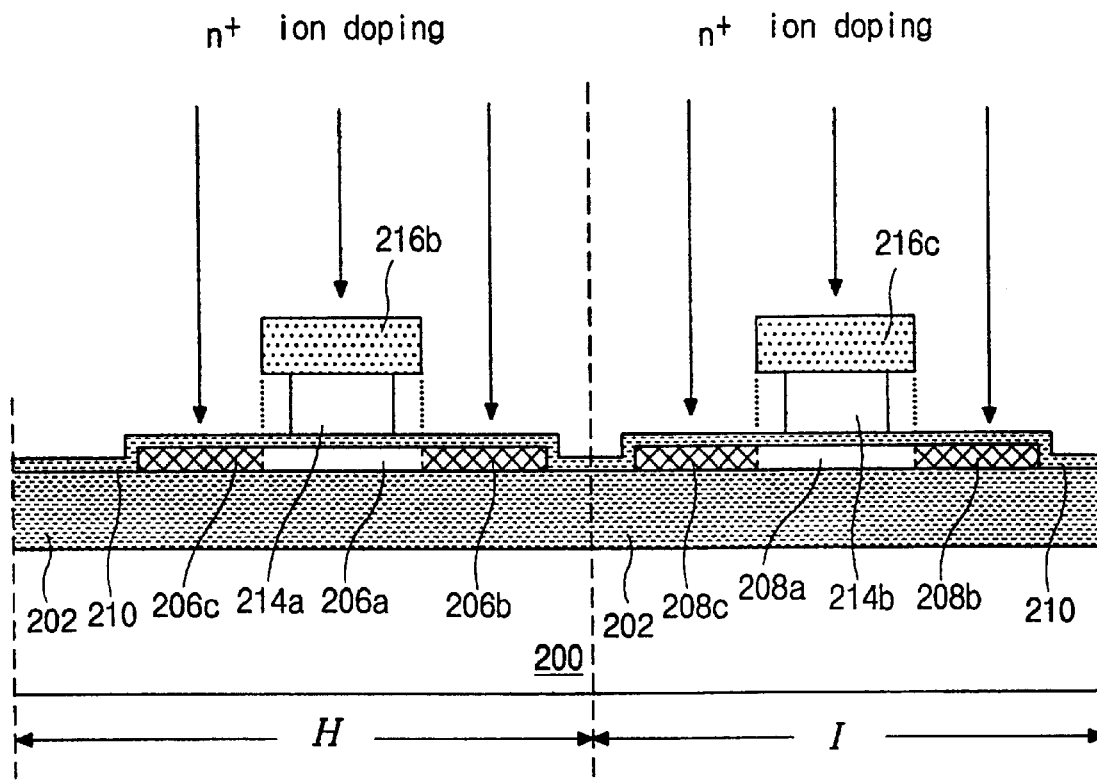
FIGS. 12A to 12D are cross-sectional views of manufacturing process of thin film transistors in the driving portion according to second embodiment of the present invention.

As shown in FIGS. 11A and 12A, a buffer layer 202 is formed on a transparent substrate 200 and semiconductor layers are formed on the buffer layer 202. The semiconductor layer is single crystalline silicon and may be formed by the sequential lateral solidification (SLS) method explained above. After an insulating layer 210 and a metal layer are sequentially deposited on the semiconductor layer, the first photoresist patterns 216a, 216b and 216c are formed on the metal layer through a photolithography process. Then, the metal layer is etched using the first photoresist patterns 216a, 216b and 216c as a mask, and gate electrodes 212, 214a and 214b are formed. At this time, the gate electrodes 212, 214a and 214b are over-etched because of anisotropic etching properties, so that they have narrower width than the first photoresist patterns 216a, 216b and 216c. Subsequently, an $n^+$ ion doping is accomplished on the substrate 200 using the first photoresist patterns 216a, 216b and 216c as a doping mask, and $n^+$ions are injected into the semiconductor layer 204b, 204c, 206b, 206c, 208b and 208c uncovered with the first photoresist patterns 216a, 216b and 216c. Therefore, $n^+$ source and drain regions 204b, 204c, 206b, 206c, 208b and 208c are formed. Here, the $n^+$ ion dose is about $1\times10^{15}/cm^2$ to $2\times10^{15}/cm^2$.

Figure 11B:
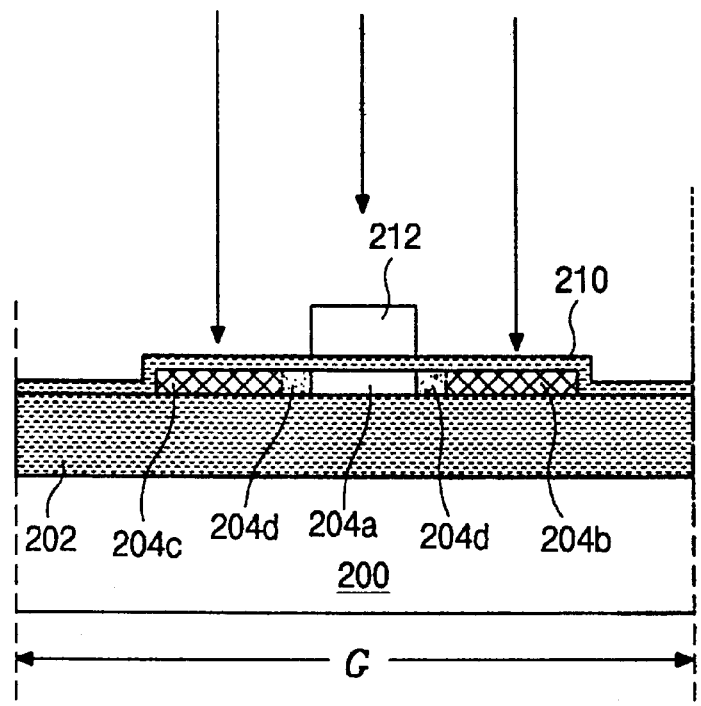
Figure 12B:
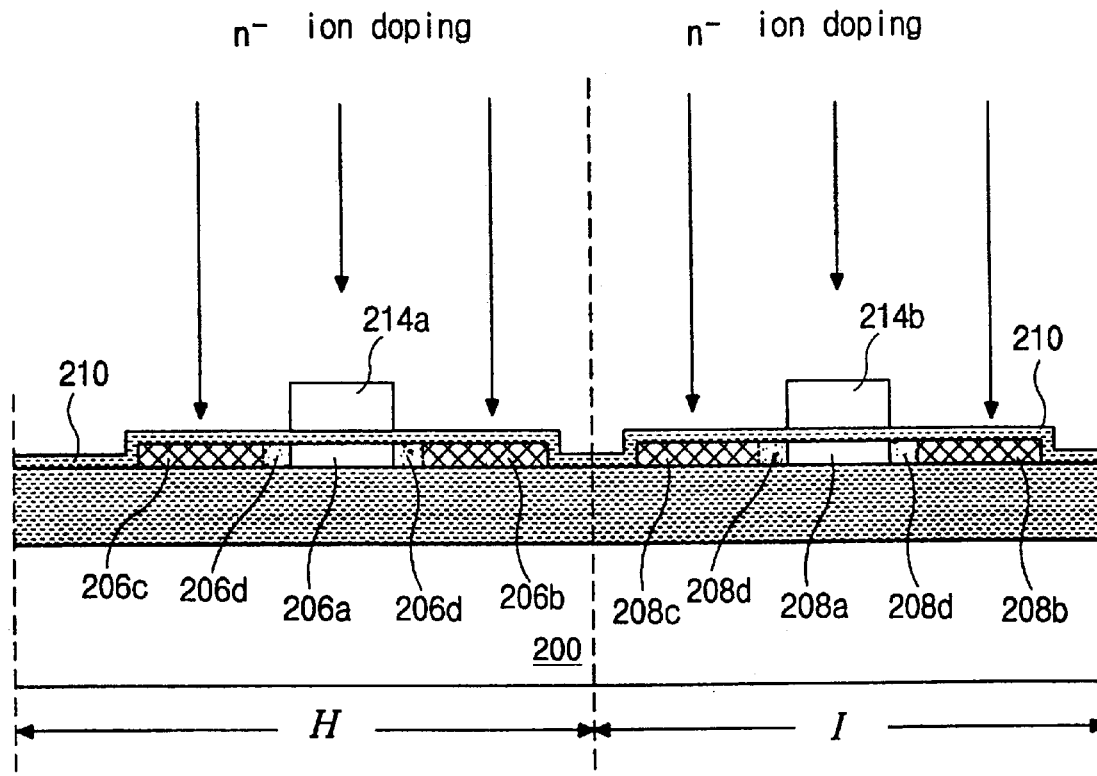

In FIGS. 11B and 12B, the first photoresist patterns 216a, 216b and 216c of FIGS. 11A and 12A are removed by ashing and n⁻ ion doping, having dose of about $10^{13}/cm^2$, is performed using the gate electrodes 212, 214a and 214b as a doping mask. The n⁻ ion doped regions 204d, 206d and 208d close to the gate electrodes 212, 214a and 214b become lightly doped drain (LDD) regions. At this time, the n⁺ source and drain regions 204b, 204c, 206b, 206c, 208b and 208c are not affected because the n⁻ ion dose is much less than the n⁺ ion dose. The center portions 204a, 206a and 208a of the semiconductor layers under the gate electrodes 212, 214a and 214b, do not include impurities and become active layers of thin film transistors.

Figure 11C:
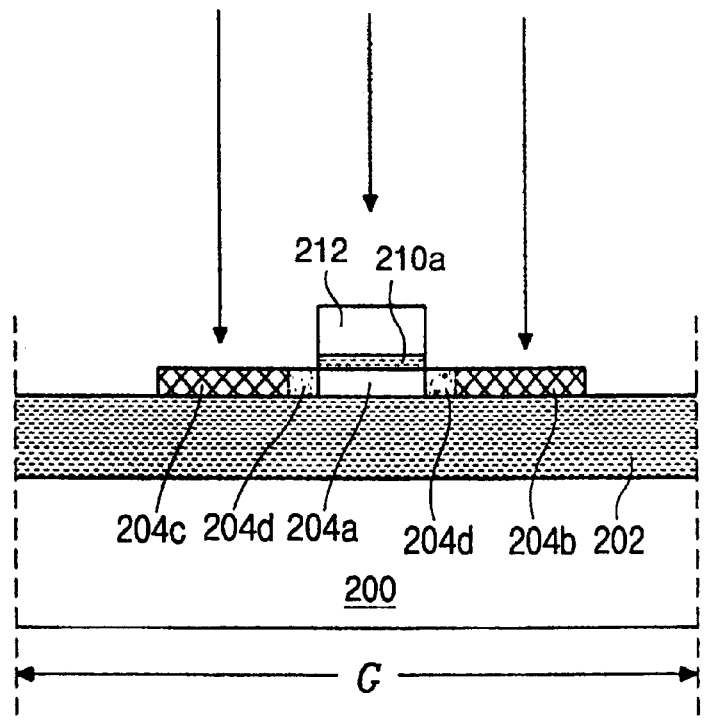
Figure 12C:
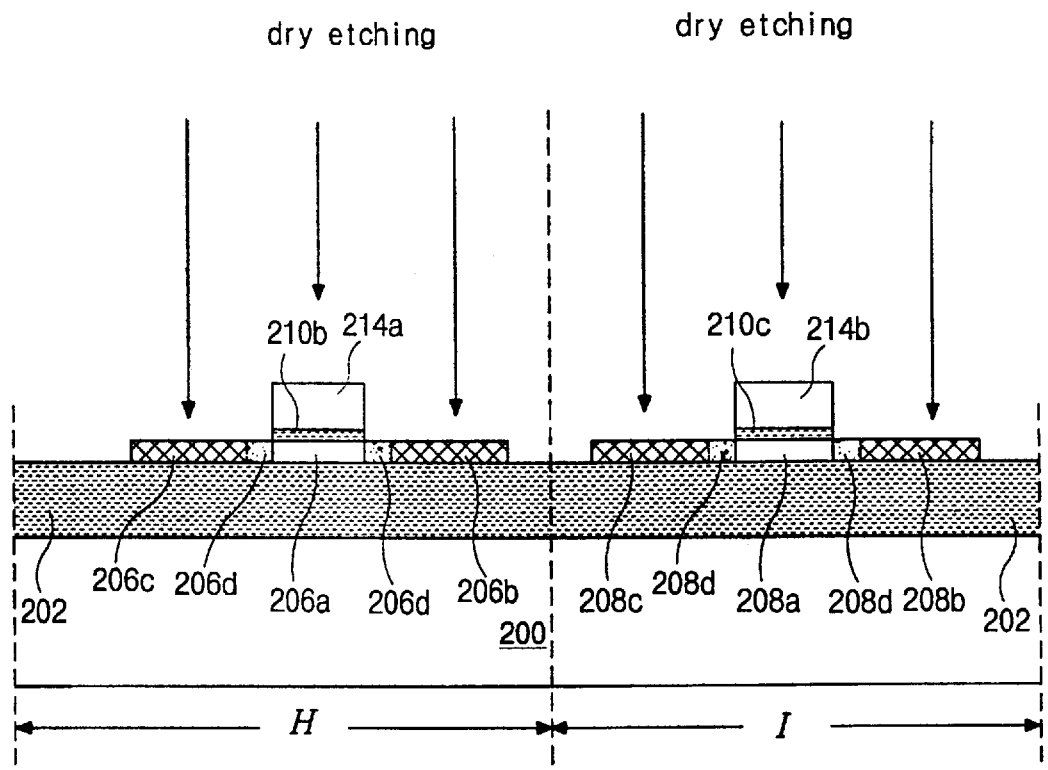

Next, in FIGS. 11C and 12C, the insulating layer 210 of FIGS. 11B and 12B is etched using the gate electrodes 212, 214a and 214b as a etching mask by a dry etching method. Then, gate insulators 210a, 210b and 210c, which have a width substantially equal to the gate electrodes 212, 214a and 214b, are formed. On the other hand, the insulating layer 210 of FIGS. 11B and 12B may remain.

Figure 11D:
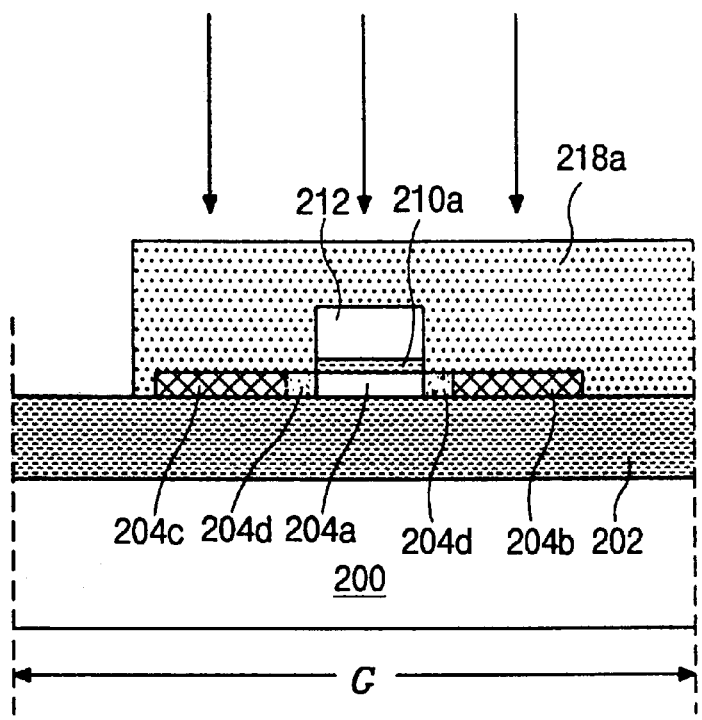
Figure 12D:
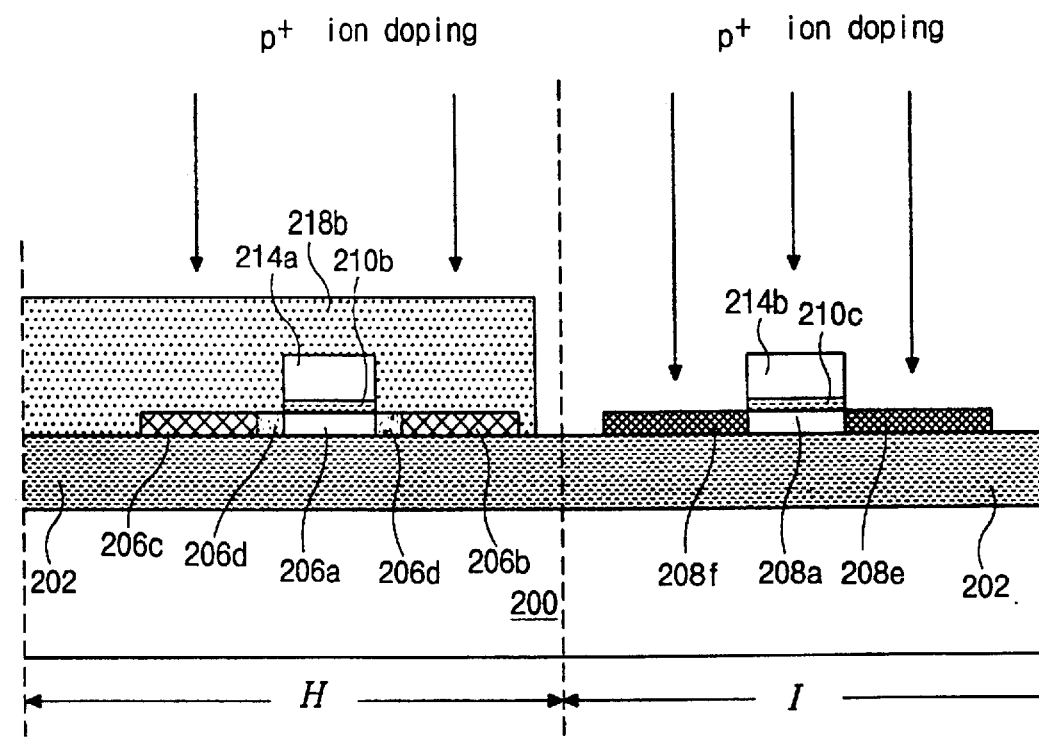

In FIGS. 11D and 12D, the second photoresist patterns 218a and 218b are formed in the first and second regions "G" and "H", respectively, through another photolithography process. The second photoresist pattern 218a of the first region "G" covers the gate electrode 212, the n⁺ source and drain regions 204b and 204c, and the LDD region 204d. The second photoresist pattern 218b of the second region "H" covers the gate electrode 214a, the n⁺ source and drain regions 206b and 206c, and the LDD region 206d. And p⁺ ion doping is carried out using the second photoresist patterns 218a and 218b as a doping mask. Here, the p⁺ ion dose should be larger than the n⁺ ion dose. Then, p⁺ ions are injected into the exposed semiconductor layer of the third region "I", and p⁺ source and drain regions 208e and 208f are formed due to more p⁺ ion dose of about $3\times10^{15}/cm^2$ to $4\times10^{15}/cm^2$ compared with the n⁺ion dose. The second photoresist patterns 218a and 218b are removed. Subsequently, other processes will be followed as in the first embodiment.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate having drive integrated circuits, comprising:
   forming first and second semiconductor layers on a substrate;
   depositing an insulating material on the first and second semiconductor layers;
   depositing a metal on the insulating material;
   forming first photoresist patterns on the metal, the first photoresist patterns being over the first and second semiconductors;
   forming first and second gate electrodes over the first and second semiconductor layers, respectively, by etching the metal, the first and second gate electrodes being narrower than the first photoresist patterns;
   forming first and second insulator patterns on the first and second semiconductor layers, respectively, by etching the insulating material, the first and second insulator patterns having substantially the same width to the first photoresist patterns;
   doping n⁺ ions by using the first photoresist patterns as a first doping mask;
   ashing the first photoresist patterns, thereby the first photoresist patterns becoming reduced first photoresist patterns, the reduced first photoresist patterns having substantially the same width as the first and second gate electrodes;
   etching the first and second insulator patterns by using the reduced first photoresist patterns as an etching mask;
   doping n⁻ ions by using the reduced first photoresist patterns as a second doping mask;
   removing the reduced first photoresist patterns after the doping n⁻ ions;
   forming a second photoresist pattern, the second photoresist pattern covering the first gate electrode and the first semiconductor layer;
   doping p⁺ ions by using the second photoresist pattern and the second gate electrode as a third doping mask; and
   removing the second photoresist pattern after the doping p⁺ ions.

2. The method according to claim 1, wherein dose of p⁺ ions is larger than that of n⁺ ions.

3. The method according to claim 2, wherein the dose of p⁺ ions is about $3\times10^{15}/cm^2$ to $4\times10^{15}/cm^2$.

4. The method according to claim 3, wherein the dose of n⁺ ions is about $1\times10^{15}/cm^2$ to $2\times10^{15}/cm^2$.

5. The method according to claim 4, wherein dose of n– ions is about $10^{13}/cm^2$.

6. The method according to claim 1, wherein the first semiconductor layer includes an active layer, n⁺ source and drain regions, and a lightly doped drain region between the active layer and the n⁺ source region.

7. The method according to claim 1, wherein the first semiconductor layer includes an active layer, n⁺ source and drain regions, and a lightly doped drain region between the active layer and the n⁺ drain region after the dopings.

8. The method according to claim 1, wherein the second semiconductor layer includes an active layer, p⁺ source and drain regions after the dopings.

9. The method according to claim 1, wherein the first and second semiconductor layers are made of SLS crystalline silicon.

10. A method of manufacturing an array substrate having drive integrated circuits, comprising:
    forming first and second semiconductor layers on a substrate;
    depositing an insulating material on the first and second semiconductor layers;
    depositing a metal on the insulating material;
    forming first photoresist patterns on the metal, the first photoresist patterns being over the first and second semiconductors;
    forming first and second gate electrodes over the first and second semiconductor layers, respectively, by etching the metal, the first and second gate electrodes being narrower than the first photoresist patterns;
    doping n⁺ ions by using the first photoresist patterns as a first doping mask;
    removing the first photoresist patterns;
    doping n⁻ ions by using the first and second gate electrodes as a second doping mask;
    forming a second photoresist pattern, the second photoresist pattern covering the first gate electrode and the first semiconductor layer;
    doping p⁺ ions by using the second photoresist pattern and the second gate electrode as a third doping mask; and removing the second photoresist pattern after the doping p$^+$ ions.

11. The method according to claim 10, wherein dose of p$^+$ ions is larger than that of n$^+$ ions.

12. The method according to claim 11, wherein the dose of p$^+$ ions is about $3\times10^{15}/cm^2$ to $4\times10^{15}/cm^2$.

13. The method according to claim 12, wherein the dose of n$^+$ ions is about $1\times10^{15}/cm^2$ to $2\times10^{15}/cm^2$.

14. The method according to claim 13, wherein dose of n$^-$ ions is about $10^{13}/cm^2$.

15. The method according to claim 10, wherein the first semiconductor layer includes an active layer, n$^+$ source and drain regions, and a lightly doped drain region between the active layer and the n$^+$ source region.

16. The method according to claim 10, wherein the first semiconductor layer includes an active layer, n$^+$ source and drain regions, and a lightly doped drain region between the active layer and the n$^+$ drain region after the dopings.

17. The method according to claim 10, wherein the second semiconductor layer includes an active layer, p$^+$ source and drain regions after the dopings.

18. The method according to claim 10, further comprising a step of etching the insulating material by using the gate electrodes as a etching mask.

19. The method according to claim 18, wherein the insulating material is etched using a dry etching method.

20. The method according to claim 10, wherein the first and second semiconductor layers are made of SLS crystalline silicon.

* * * * *